US 12,135,577 B2

(12) United States Patent
Patel (10) Patent No.: US 12,135,577 B2
(45) Date of Patent: Nov. 5, 2024

(54) LOW POWER AND HIGH SPEED SCAN DUMP

(71) Applicant: Advanced Micro Devices, Inc., Santa Clara, CA (US)

(72) Inventor: Nehal Patel, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 64 days.

(21) Appl. No.: 17/990,566

(22) Filed: Nov. 18, 2022

(65) Prior Publication Data

US 2024/0168513 A1 May 23, 2024

(51) Int. Cl.
*G06F 1/10* (2006.01)
(52) U.S. Cl.
CPC .................. *G06F 1/10* (2013.01)
(58) Field of Classification Search
CPC ................ G06F 1/10; G06F 1/3237
See application file for complete search history.

(56) References Cited

U.S. PATENT DOCUMENTS

2012/0226953 A1\* 9/2012 Nakazato ............... G06F 11/27
714/E11.155

OTHER PUBLICATIONS

Wikipedia; "Scan Chain", downloaded from https://en.wikipedia.org/wiki/Scan_chain on Nov. 18, 2022, 2 pgs.

\* cited by examiner

*Primary Examiner* — Stefan Stoynov
(74) *Attorney, Agent, or Firm* — Volpe Koenig (57) ABSTRACT

A disclosed technique includes clock gating a plurality of data elements of a first clock domain of a scan dump network; outputting data from a plurality of data elements of a second clock domain of the scan dump network; clock gating the plurality of data elements of the second clock domain; and outputting data from the plurality of data elements of the first clock domain.

20 Claims, 6 Drawing Sheets

LOW POWER AND HIGH SPEED SCAN DUMP

BACKGROUND

Debugging techniques for hardware integrated circuits are more difficult than those used for software. Unlike software, in which the contents of memory or other state can generally be viewed in a software debugger, integrated circuits include elements that are not readily externally visible. Thus techniques for providing visibility into the workings of integrated circuits are important.

BRIEF DESCRIPTION OF THE DRAWINGS

A more detailed understanding can be had from the following description, given by way of example in conjunction with the accompanying drawings wherein.

DETAILED DESCRIPTION

A disclosed technique includes clock gating a plurality of data elements of a first clock domain of a scan dump network; outputting data from a plurality of data elements of a second clock domain of the scan dump network; clock gating the plurality of data elements of the second clock domain; and outputting data from the plurality of data elements of the first clock domain.

Figure 1:
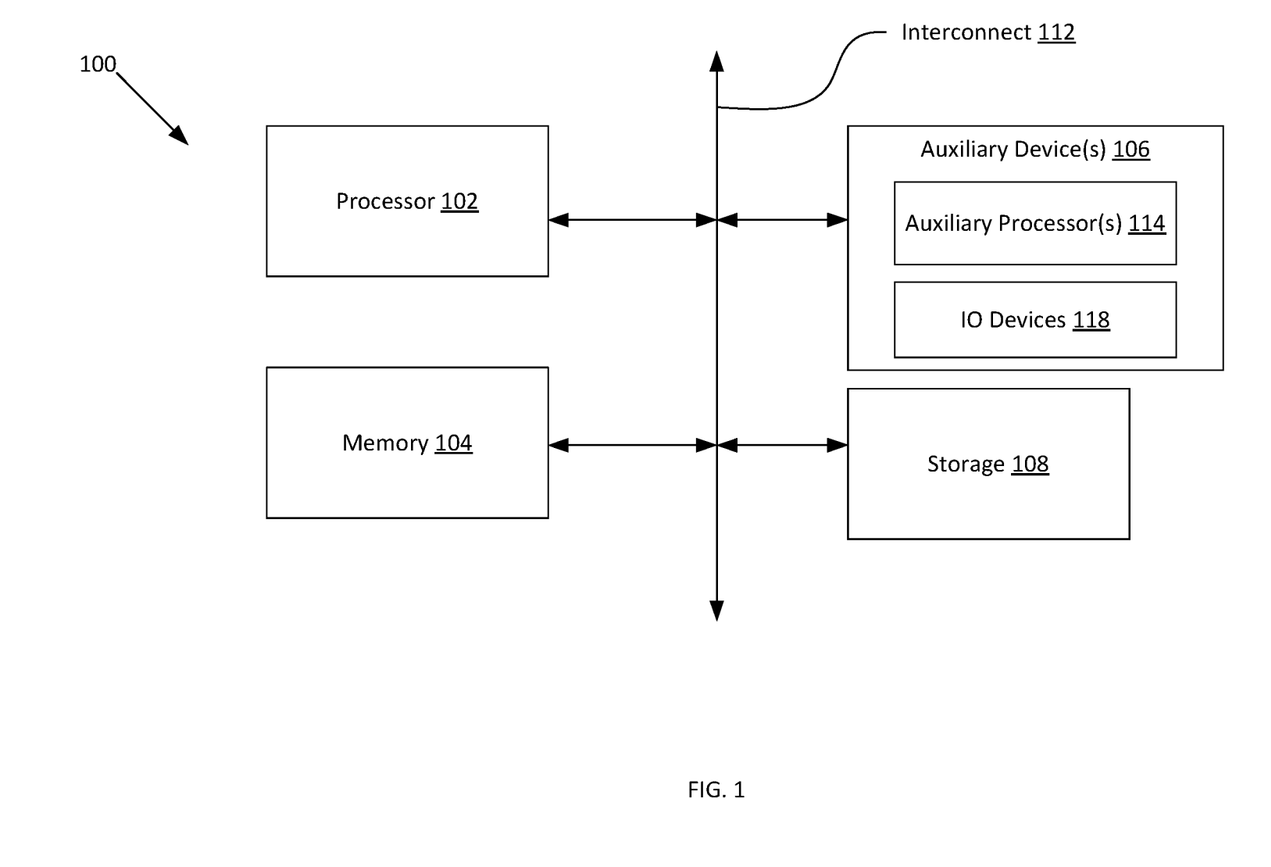
FIG. 1 is a block diagram of an example device in which one or more features of the disclosure can be implemented.

FIG. 1 is a block diagram of an example computing device 100 in which one or more features of the disclosure can be implemented. In various examples, the computing device 100 is one of, but is not limited to, for example, a computer, a gaming device, a handheld device, a set-top box, a television, a mobile phone, a tablet computer, or other computing device. The device 100 includes, without limitation, one or more processors 102, a memory 104, one or more auxiliary devices 106, and a storage 108. An interconnect 112, which can be a bus, a combination of buses, and/or any other communication component, communicatively links the one or more processors 102, the memory 104, the one or more auxiliary devices 106, and the storage 108.

In various alternatives, the one or more processors 102 include a central processing unit (CPU), a graphics processing unit (GPU), a CPU and GPU located on the same die, or one or more processor cores, wherein each processor core can be a CPU, a GPU, or a neural processor. In various alternatives, at least part of the memory 104 is located on the same die as one or more of the one or more processors 102, such as on the same chip or in an interposer arrangement, and/or at least part of the memory 104 is located separately from the one or more processors 102. The memory 104 includes a volatile or non-volatile memory, for example, random access memory (RAM), dynamic RAM, or a cache.

The storage 108 includes a fixed or removable storage, for example, without limitation, a hard disk drive, a solid state drive, an optical disk, or a flash drive. The one or more auxiliary devices 106 include, without limitation, one or more auxiliary processors 114, and/or one or more input/output ("IO") devices 118. The auxiliary processors 114 include, without limitation, a processing unit capable of executing instructions, such as a central processing unit, graphics processing unit, parallel processing unit capable of performing compute shader operations in a single-instruction-multiple-data form, multimedia accelerators such as video encoding or decoding accelerators, or any other processor. Any auxiliary processor 114 is implementable as a programmable processor that executes instructions, a fixed function processor that processes data according to fixed hardware circuitry, a combination thereof, or any other type of processor.

The one or more IO devices 118 include one or more input devices, such as a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals), and/or one or more output devices such as a display, a speaker, a printer, a haptic feedback device, one or more lights, an antenna, or a network connection (e.g., a wireless local area network card for transmission and/or reception of wireless IEEE 802 signals).

The device 100 has a very large number of flip flops that store data that can change every clock cycle. Flip flops are ubiquitous throughout processing devices such as the processor 102, auxiliary devices 106, storage 108, or memory 104. When a hardware is developing a component such as one of these items, the hardware developer needs to debug the operation of such component. Often, such debugging includes obtaining the contents of the flip flops of such components to help track down the location and reason for bugs.

While some flip flops are directly accessible by a normal, non-debug interface, typically a much larger number of flip flops are "opaque" to such interfaces. Thus, devices operating in debug mode include a flip flop read-out network that allows for direct reading of the data stored in flip flops of the component.

Figure 2:
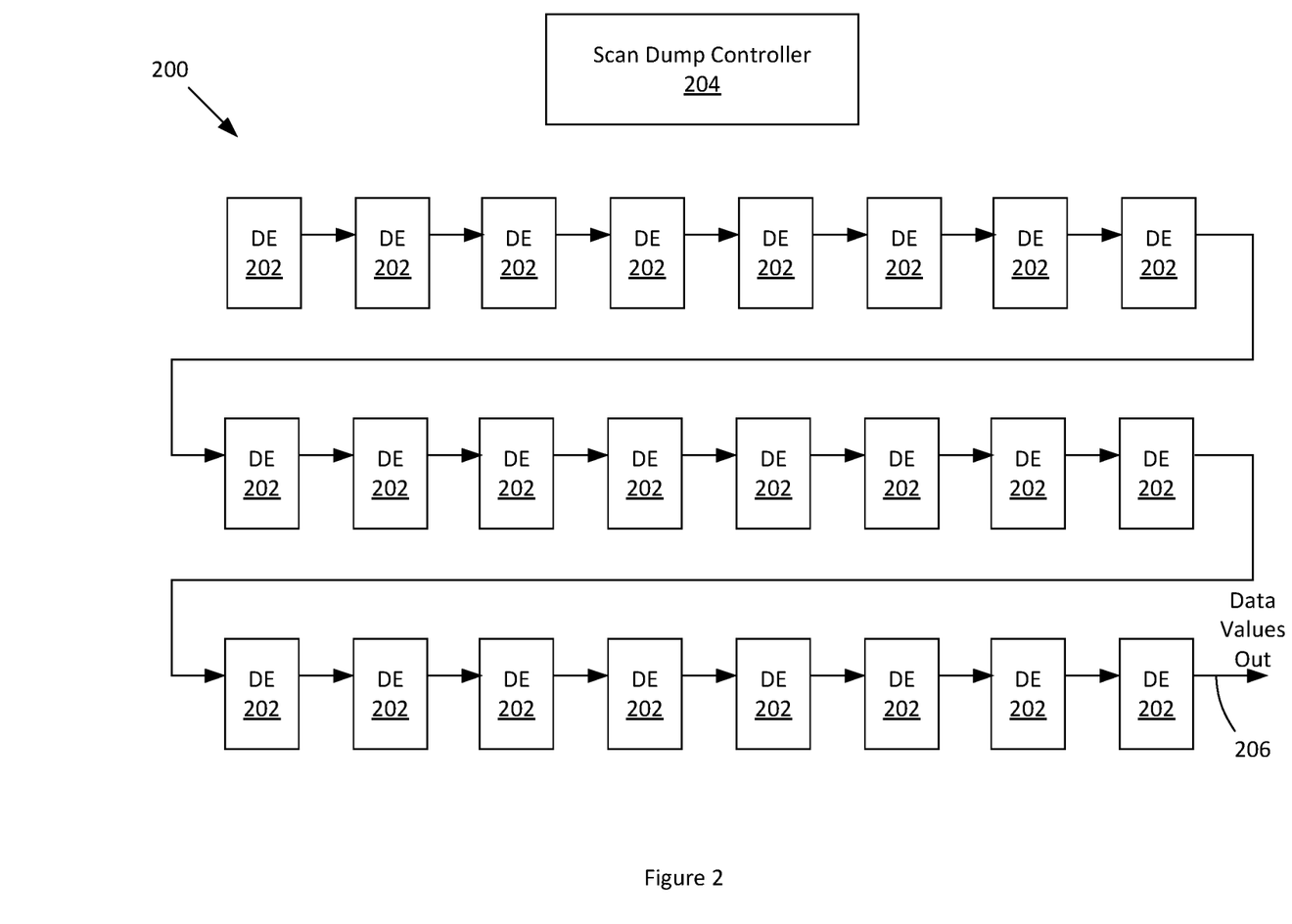
FIG. 2 illustrates a data element network, according to an example.

FIG. 2 illustrates a data element network 200, according to an example. The data element network 200 is a network of data elements 202 throughout a component (e.g., the processor 102 or auxiliary device 106). The illustrated network, including the connectivity, illustrates connectivity for the purpose of "reading out" the contents of the flip flops, rather than for "normal operation." In some examples, the activity of reading out the contents of these flip flops is referred to as performing a "scan dump."

The term "data element" refers to a portion of a device that is capable of storing a unit of data. In some examples, the unit is one bit. In some examples, a data element 202 is a flip flop. A flip flop is a circuit that stores one bit (i.e., either a 0 or a 1) of information. A flip flop has a data input, a clock input, and an output, as well as the internal storage for the bit. When the clock cycles (i.e., changes from low to high or high to low), the flip flop stores the data on the data input into the internal storage. The output reflects the internal storage. Circuit logic can exist between flip flops 202 to transform the data stored in the flip flops, which is then stored in other flip flops.

In FIG. 2, the network 200 for outputting data values for debugging is shown. In some examples, a network 200 of the type shown in FIG. 2 is called a scan dump network 200. This network includes a "chain" of data elements 202. In some examples, each of the data elements 202 in a particular device includes inputs and outputs for a scan dump that are different than the inputs and outputs for normal operation. In some examples, the data elements 202 in a network 200 of data elements 202 each include an input from a prior data element 202 (except for the first data element 202) and output to a subsequent data element 202. Thus, the data elements 202 of a scan dump network 200 form a sequence of data elements 202.

To perform a scan dump for the network of FIG. 2, a scan dump controller 204 causes the contents of the data elements 202 to flow serially through the data elements 202 towards the output port 206. To facilitate this operation, the scan dump controller 204 clocks each of the data elements 202 at a scan dump frequency. This clocking causes each of the data elements 202 to provide the stored value as output to the subsequent data element 202 and to store the output from the previous data element 202 internally. Thus, repeated clocking of the data elements 202 causes the internal values of the data elements 202 to flow sequentially through each of the data elements 202 to the output port 206. The result is a serial signal including a sequence of bits that indicate the contents of the data elements 202 when the scan dump begins.

One issue with the technique described above is that, because all of the data elements 202 are clocked every cycle, the clock rate must be set relatively low, to avoid excessive power draw and heat generation. More specifically, flip flops have a dynamic operation power dissipation that occurs when the flip flop is clocked. Thus, clocking flip flops is associated with a particular amount of power dissipation. The more flip flops are clocked, the greater the power draw. Further, power draw results in heat generation, so if the power draw is too high, it is possible for the temperature of the device to exceed a safe or desirable temperature. For at least this reason, the technique described above is operated with a relatively low clock frequency, such as 50 megahertz (MHz) or 100 MHz. This low clock frequency results in a very long time to read out the contents of all flip flops 202 of a device.

Figure 3:
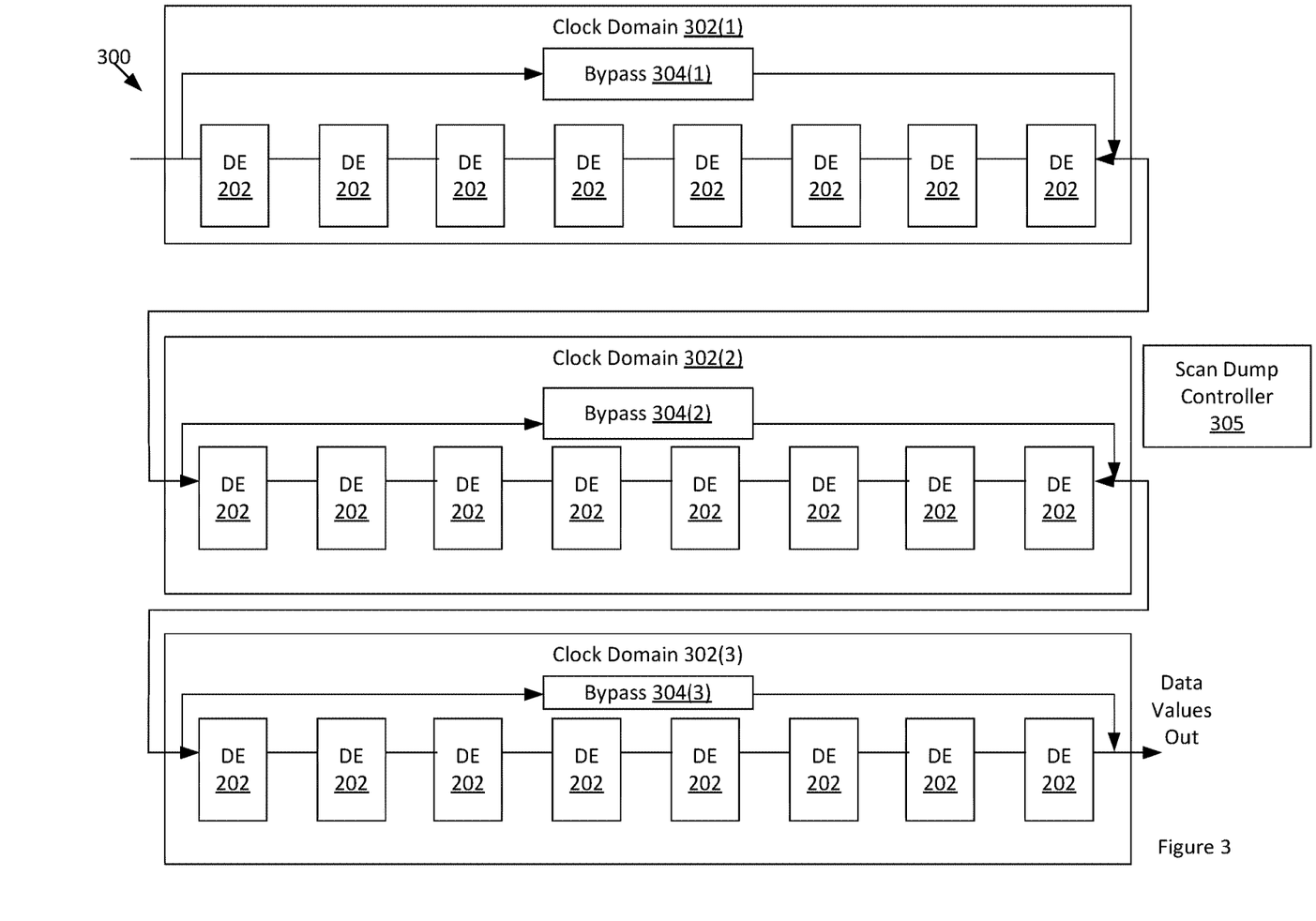
FIG. 3 illustrates a scan dump network that includes a plurality of clock domains, according to an example.

For the above reasons, another technique is provided herein. FIG. 3 illustrates a scan dump network 300 that includes a plurality of clock domains 302, according to an example. Each clock domain 302 includes a plurality of data elements 202 and a bypass 304. The bypass 304 includes circuitry configured to perform the operations described herein. Statements such as "the bypass 304 [performs an action]" should be understood as indicating that the circuitry of the bypass 304 is configured to perform the action.

The clock domains 302 are independently clockable. More specifically, it is possible for any particular clock domain 302 to clock gate the data elements 202 of that clock domain 302. Clock gating data elements 202 cause the clock signal to be temporarily disabled. This action limits the power dissipation for the data elements 202 and also causes the stored values for the data elements 202 to remain in each data element 202 rather than being transferred forward to the next data element 202.

To transmit all data from the data elements 202, a first clock domain 302(3) does not power gate the data elements 202 of that clock domain 302(3) and instead clocks those data elements 202 to transmit the stored values to an output. During this period, the other clock domains 302 clock gate their data elements 202 to prevent a large amount of power draw for the entire device. Then, a second clock domain 302(2) does not clock gate the data elements 202 within that clock domain 302(2) and the other clock domains 302 clock gate the data elements 202 within those clock domains. A clock domain that receives output from another clock domain passes through that output via a bypass 304. For example, if the clock domain 302(2) is clocking data elements 302 of that clock domain 302(2), then clock domain 302(3) activates the bypass 304(3) of that clock domain 302(3). When that bypass 304(3) is activated, the data provided from clock domain 302(2) passes through the clock domain 302(3) to the output of that clock domain 302(3), via the bypass 304(3). Because the bypass serves the function of passing through these values, the data elements 202 of clock domain 302(3) do not need to be clocked and the power dissipation associated with such clocking can be avoided. In some examples, the bypass 304(3) itself includes a single clocked element to store data for forwarding to a subsequent clock domain 302.

The clock domains 302 determine whether to operate in a mode in which the data elements 202 are clocked and are outputting their contents (an "output mode") or a mode in which the data elements 202 are not clocked and the bypass 304 is active (a "bypass mode"). In some examples, circuitry within the bypass 304 determines when to operate in the output mode or the bypass mode. In some examples, the bypass 304 for each clock domain 302 determines a time during which to operate in the output mode. The bypass 304 operates the clock domain 302 in the output mode in that determined time and operates the clock domain 302 in the bypass mode outside of that determined time.

In some examples, a scan dump controller 305, which is similar to the scan dump controller 204 of FIG. 2, provides information to the bypasses 304 indicating a time at which the bypass 304 should begin the output mode. In other examples, the bypasses 304 include hard-wired memories or circuit elements that store an indication of the time at which the bypass 304 should begin the output mode. In some examples, this time is measured from the time at which the entire scan dump network 300 begins performing a scan dump. In some examples, the time is stored as a number of cycles, which lets a counter in the bypass 304 count a number of cycles since the scan dump network 300 begins performing a scan dump before the bypass 304 activates and causes the data elements 202 to begin being clocked. In some examples, the number of cycles is related to the number of data elements 202 that are "ahead of" that bypass 304, so that the bypass 304 waits for all such data elements 202 to read out their values before beginning operating the data elements 202 associated with the bypass 304 in the output mode.

In summary, in the scan dump network 300 of FIG. 3, the data elements 202 are assigned to clock domains 302. Each clock domain includes a bypass 304 that operates the clock domain 302 in either an output mode or a bypass mode. In the bypass mode, the clock domain 302 acts as a pass through, passing values from prior clock domains 302 to subsequent clock domains 302. In the output mode, the clock domain 302 outputs data from its data elements 202 in turn. Each clock domain 302 thus takes turns outputting values of data elements 202 and thus clocking its data elements 202, while the data elements 202 of other clock domains 302 are clock gated. Because the total number of data elements 202 that are clocked at any given time is much less than all data elements 202 of the scan dump network 300, the total power draw is significantly less than in FIG. 2, and the clock can be operated at a much higher frequency, which greatly reduces the time to scan out the data of the data elements 202.

Figure 4:
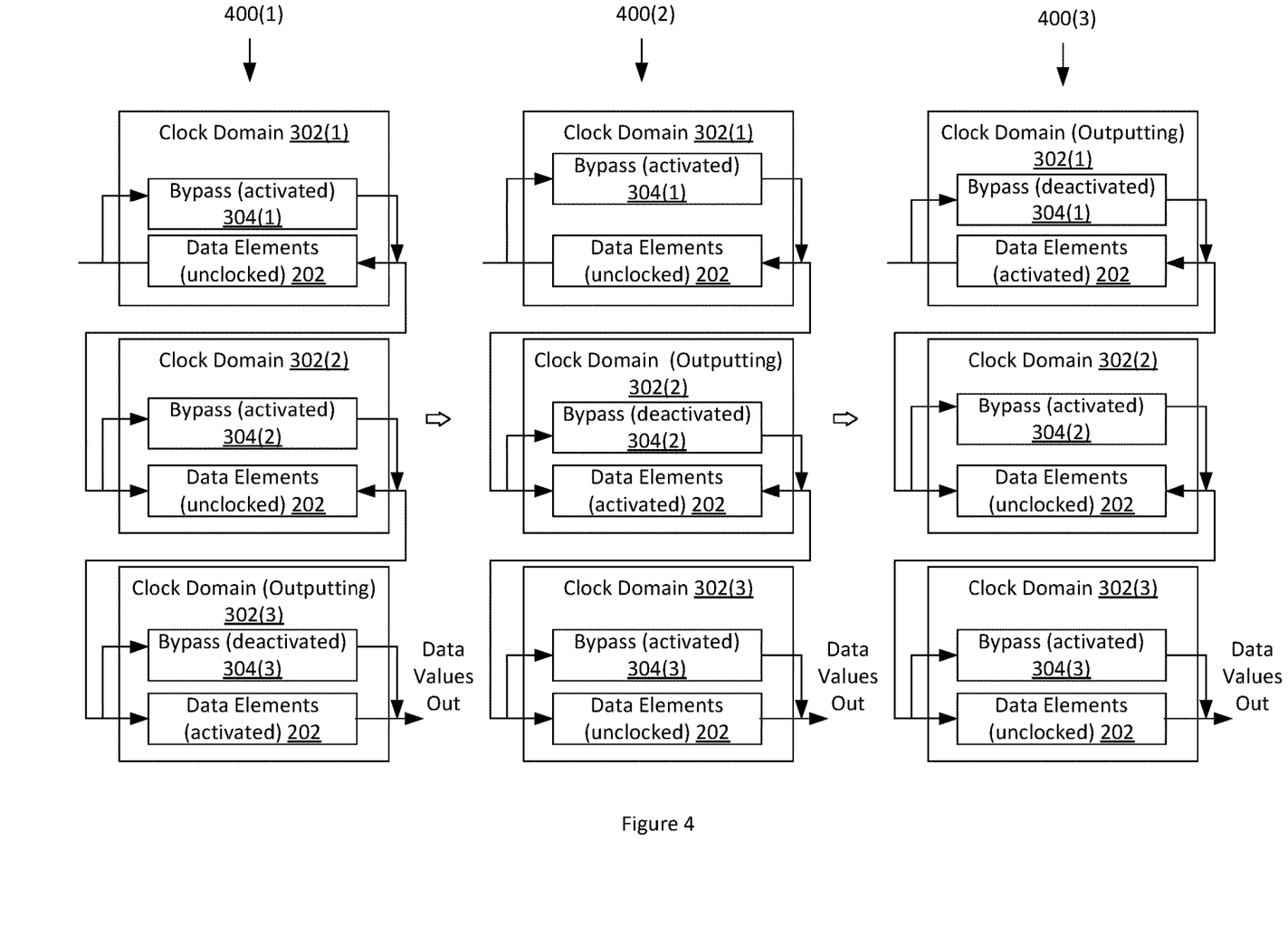
FIG. 4 illustrates a sequence of operations for performing a scan dump, according to an example.

FIG. 4 illustrates a sequence of operations for performing a scan dump, according to an example. Three different time points 400 are shown. Time point 400(3) is after time point 400(1) and 400(2) and time point 400(2) is after time point 1 400(1). In each time point 400, a different clock domain 302 is active and outputting data while the other two clock domains 302 illustrated are inactive and operating in pass-through mode.

At time point 1 400(1), clock domain 3 302(3) is active and is thus outputting data from its data elements 202. Clock domain 2 302(2) and clock domain 1 302(1) are both inactive, meaning their data elements 202 are unclocked and thus consuming much less power than if clocked. After all data elements of the clock domain 3 302(3) have output their values, time point 2 400(2) occurs.

At time point 2 400(2), clock domain 2 302(2) is active and outputting and clock domain 1 302(1) and clock domain 3 302(3) are in bypass mode. Clock domain 302(2) outputs values from its data elements 202, which are clocked, to clock domain 3 302(3). The bypass 304(3) of clock domain 3 302(3) passes these values through to the output of the scan dump network. The data elements 202 of clock domain 3 302(3) and clock domain 1 302(1) are unclocked and thus drawing less power than if clocked. After all data elements of clock domain 2 302(2) have output their values, time point 3 400(3) occurs.

At time point 3 400(3), both clock domain 2 302(2) and clock domain 3 302(3) are operating in bypass mode and clock domain 1 302(1) is output values from its data elements 202. Clock domain 2 302(2) and clock domain 3 302(3) are passing these values through, to the output of the scan dump network. Since the data elements 202 of clock domain 2 302(2) and clock domain 3 302(3) are unclocked, much less power is drawn by those data elements 202 than if these data elements 202 were clocked.

Figure 5:
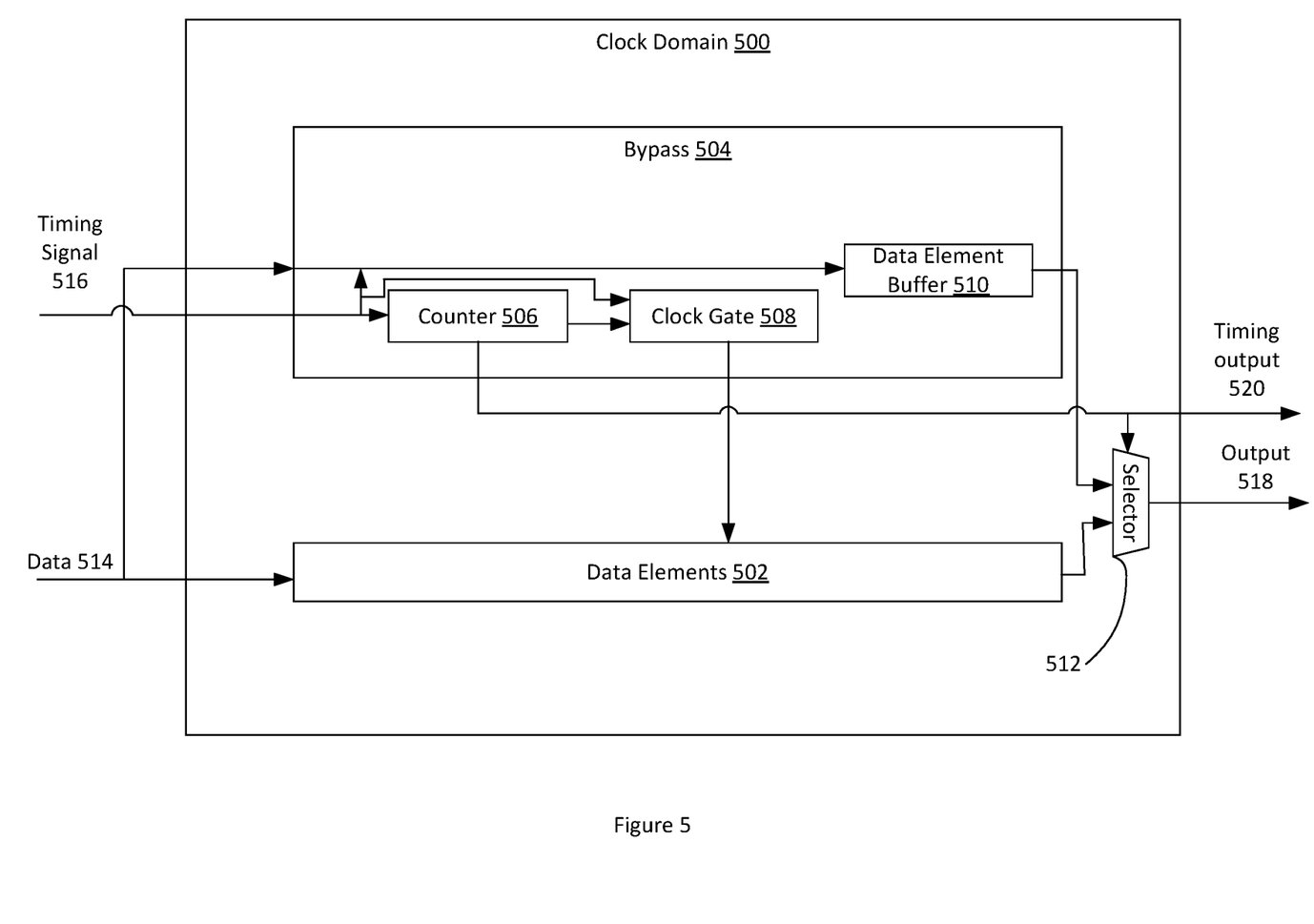
FIG. 5 illustrates an example clock domain.

FIG. 5 illustrates an example clock domain 500. Clock domain 500 illustrates example details for the clock domains 302 described elsewhere herein. Data elements 502 are similar to the data elements 202 described elsewhere herein. The bypass 504 includes additional details not described elsewhere, with respect to bypass 304. The clock domain 500 also includes a selector 512 (which, in some examples, is a multiplexor), which is configured to select either output from the bypass 504 or the data elements 502 based on an input signal from the counter 506. The counter 506, clock gate 508, data element buffer 510, and selector 512 are all, in various examples, circuits. The counter 506 is a counter circuit configured to count down or up. The clock gate 508 is circuitry configured to cause the data elements 502 to be clock gated (i.e., for the clocks not to advanced) or to not be clock gated (for the clocks to advance).

The bypass 504 includes a counter 506, a clock gate 508, and a data element buffer 510. The counter 506 is a counter circuit configured to count down (or up). The clock gate 508 is a logic circuit that controls clock gating for the data elements 502 based on input described herein. The data element buffer 510 is a data storage element that buffers data input to the clock domain 500 via data input 514. A timing signal input 516 provides timing information from other clock domains 500.

When the scan dump begins, each clock domain 500 is set to bypass mode, except for the clock domain 500 at the end of the scan dump network. A clock domain is at the end of a scan dump network if the output 518 of the clock domain 500 is coupled to the output of the scan dump network without any intervening clock domains 500. In other words, a clock domain 500 at the end of a scan dump network is the first clock domain 500 to output for the scan dump network.

In addition, when the scan dump begins, or before the scan dump begins, each counter 506 is loaded with a value that correlates to the number of data elements 502 in the clock domain 500. This counter 506 begins to count down in the situation that the clock domain 500 is enabled for reading out the contents of the data elements 502 by an earlier clock domain 500. Moreover, the counter 506 sends a signal to the subsequent clock domain 500 when the counter indicates that the clock domain 500 is finished reading out the contents of the data elements 502 (e.g., when the counter has counted down to zero or one, or some low value designated to indicate completion of read-out of the data elements 502).

While the counter 506 is counting down, the counter 506 causes the clock gate 508 to clock the data elements 502 so that the data in the data elements proceeds through the individual data elements 202 and out to the output 518 via the selector 512. When the counter 506 is not counting down, the counter 506 causes the clock gate 508 to clock gate the data elements 502, causing the data elements 502 to not provide their contents to the subsequent data elements 502 and to therefore consume much less power than when the data elements 502 are clocked. The selector 512 receives a selection signal from the counter 506. The counter 506 causes the selector 512 to select an element from the data elements 502 when the counter 506 indicates that the clock domain 500 should output data from its own data elements 502 (e.g., while the clock domain 500 is counting down) and the counter 506 causes the selector 512 to select a data element from the data element buffer 510 when the counter 506 indicates that the clock domain 500 is operating in bypass mode (e.g., when the counter 506 is not counting down, such as either before or after the counter has counted down).

The data element buffer 510 receives data elements from the subsequent clock domain 500 and, in bypass mode, provides those data elements to the previous clock domain 500 via the selector 512 and output 518 so that such data elements can be read out to the output of the scan dump network.

Referring to FIGS. 4 and 5 together, a sequence of operations involving multiple clock domains 500 is now described, where the clock domains 500 are example implementations of the clock domains 302 illustrated in FIG. 4. At time point 400(1), clock domain 302(1) and clock domain 302(2) have not yet received a signal for their counter 506 to begin counting down. Thus the counters 506 of those clock domains 500 are causing the clock gates 508 to clock gate their data elements 502. Further, those counters 506 are causing the data element buffer 510 to begin counting down. The counter 506 of clock domain 302(3) is counting down and is thus causing the data elements 502 to not be clock gated and to output their contents to the output of the scan dump network 300. That counter 506 is also causing the selector 512 to select the data elements 502 and not the data element buffer 510.

When the value of the counter 506 of clock domain 302(3) indicates that clock domain 302(2) should begin outputting the data from its data elements 502, the counter 506 of clock domain 302(2) begins counting down, which causes the data elements 502 of clock domain 302(2) to no longer be clock gated. This end of clock gating in turns causes values from these data elements 502 to output to the selector 512 of clock domain 302(2), and the counter 506 also causes the selector 512 to select such values, which are output via output 518 to clock domain 302(3). This output feeds to the data element buffer 510 of clock domain 302(3) and because the counter 506 of clock domain 302(3) is not counting down, clock domain 302(3) causes its selector 512 to select output from the data element buffer 510 as output for the scan network. In essence, clock domain 302(3) is operating as a pass-through.

In response to the counter 506 of clock domain 302(2) indicating completion of the read-out of the data elements 502 of clock domain 302(2), the counter 506 sends a signal to clock domain 302(1) to begin its own read-out of its data elements 502. The counter 506 of clock domain 302(1) begins counting down, causing the data elements 502 to read out their values and causing selector 512 of clock domain 302(1) to select the data from the data elements 502 for output. Clock domain 302(2) and clock domain 302(3) operate in bypass mode, since their counters have finished counting down. Note that the timing output 520 from each clock domain 500 is the output that provides a signal from the counter 506 to a subsequent clock domain 500 (i.e., from clock domain 302(2) to clock domain 302(1)) to begin reading out the contents of its data elements 502.

Figure 6:
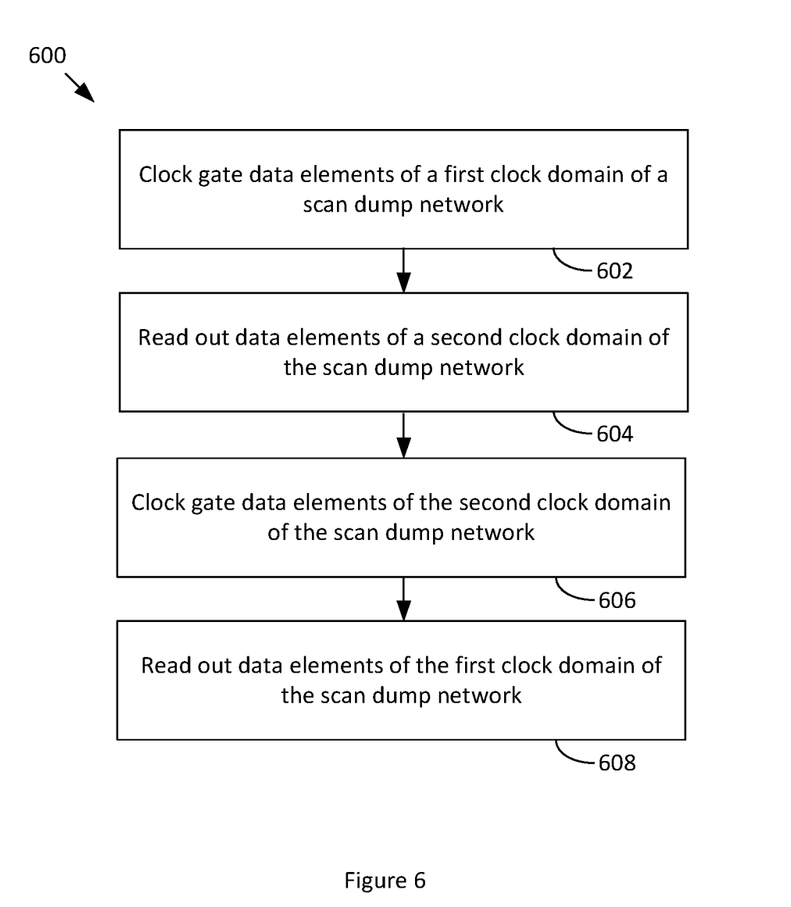
FIG. 6 is a flow diagram of a method for operating a scan dump network, according to an example.

FIG. 6 is a flow diagram of a method 600 for operating a scan dump network, according to an example. Although described with respect to the system of FIGS. 1-5, those of skill in the art will understand that any system configured to perform the steps of the method 600 in any technically feasible order falls within the scope of the present disclosure.

At step 602, a first clock domain 302 of a scan dump network 300 clock gates the data elements 202 of that clock domain 302. Clock gating those data elements 202 causes the power drawn by those data elements 202 to be significantly lower than if the clock for those data elements 202 were cycling normally. At step 604, a second clock domain 302 of the scan dump network reads out data from its data elements 202. In some examples, step 602 occurs concurrently with step 604. In some examples the first clock domain is earlier in the scan dump network 300 than the second clock domain. In some examples, as described with respect to FIG. 5, the first clock domain 302 has a counter 506 that counts down when sending out data from its data elements 202. The second clock domain 302 has a counter that is not counting down and thus clock gates its data elements 202.

At step 606, the second clock domain 302 clock gates its data elements 202, and at step 608, the first clock domain 302 reads out the data from the data elements 202 of the first clock domain 302. In some examples, the first clock domain 302 includes a counter 506 that begins counting down when the second clock domain 302 is done reading out the data from its data elements 202. In some examples, steps 606 and 608 are performed concurrently.

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the auxiliary devices 106 (including the IO devices 118 and auxiliary processor 114), scan dump controller 204, and the bypasses 304) may be implemented as a hardware electronic circuit, a general purpose computer, a processor, or a processor core, as a program, software, or firmware, stored in a non-transitory computer readable medium or in another medium, executable by a general purpose computer, a processor, or a processor core, or as a combination of two or more of a processor, a circuit, or software. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be mask-works that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method, comprising:
   clock gating a plurality of data elements of a first clock domain of a scan dump network;
   outputting data from a plurality of data elements of a second clock domain of the scan dump network;
   clock gating the plurality of data elements of the second clock domain; and
   outputting data from the plurality of data elements of the first clock domain, wherein the data output from the plurality of data elements of the first clock domain flows through the second clock domain operating in bypass mode.

2. The method of claim 1, wherein the clock gating the plurality of data elements of the first clock domain occurs concurrently with outputting data from the plurality of data elements of the second clock domain.

3. The method of claim 1, wherein the clock gating the plurality of data elements of the second clock domain occurs concurrently with the outputting data from the plurality of data elements of the first clock domain.

4. The method of claim 1, wherein the data elements of the first clock domain and the data elements of the second clock domain are configured to store data for processing by a digital circuit.

5. The method of claim 1, wherein clock gating the data elements of the first clock domain causes the data elements of the first clock domain to consume less power than if the data elements of the first clock domain were not clock gated.

6. The method of claim 1, wherein the first clock domain includes a first counter and the second clock domain includes a second counter.

7. The method of claim 6, wherein the first clock domain performs clock gating for the plurality of data elements of the first clock domain when the first counter is not counting down and the second clock domain performs clock gating for clock gates the plurality of data elements of the second clock domain when the second counter is not counting down.

8. The method of claim 6, wherein the first clock domain does not clock gate the plurality of data elements of the first clock domain when the first counter is counting down and the second clock domain does not clock gate the plurality of data elements of the second clock domain when the second counter is counting down.

9. A scan dump network, comprising:
a first clock domain including a first plurality of data elements; and
a second clock domain including a second plurality of data elements,
wherein the first clock domain is configured to clock gate the first plurality of data elements and to cause data to output from the first plurality of data elements;
wherein the second clock domain is configured to cause the second plurality of data elements to output and to clock gate the second plurality of data elements; and
wherein the data output from the plurality of data elements of the first clock domain flows through the second clock domain operating in bypass mode.

10. The scan dump network of claim 9, wherein the clock gating the first plurality of data elements of the first clock domain occurs concurrently with outputting data from the second plurality of data elements of the second clock domain.

11. The scan dump network of claim 9, wherein the clock gating the second plurality of data elements of the second clock domain occurs concurrently with the outputting data from the first plurality of data elements of the first clock domain.

12. The scan dump network of claim 9, wherein the first plurality of data elements of the first clock domain and the second plurality of data elements of the second clock domain are configured to store data for processing by a digital circuit.

13. The scan dump network of claim 9, wherein clock gating the first plurality of data elements of the first clock domain causes the first plurality of data elements of the first clock domain to consume less power than if the first plurality of data elements of the first clock domain were not clock gated.

14. The scan dump network of claim 9, wherein the first clock domain includes a first counter and the second clock domain includes a second counter.

15. The scan dump network of claim 14, wherein the first clock domain performs clock gating for the first plurality of data elements of the first clock domain when the first counter is not counting down and the second clock domain performs clock gating for the second plurality of data elements of the second clock domain when the second counter is not counting down.

16. The scan dump network of claim 14, wherein the first clock domain does not clock gate the first plurality of data elements of the first clock domain when the first counter is counting down and the second clock domain does not clock gate the second plurality of data elements of the second clock domain when the second counter is counting down.

17. A system, comprising:
a scan dump controller; and
a scan dump network configured to be controlled by the scan dump controller, the scan dump network including:
a first clock domain including a first plurality of data elements; and
a second clock domain including a second plurality of data elements,
wherein the first clock domain is configured to clock gate the first plurality of data elements and to cause data to output from the first plurality of data elements;
wherein the second clock domain is configured to cause the second plurality of data elements to output and to clock gate the second plurality of data elements; and
wherein the data output from the plurality of data elements of the first clock domain flows through the second clock domain operating in bypass mode.

18. The system of claim 17, wherein the clock gating the first plurality of data elements of the first clock domain occurs concurrently with outputting data from the second plurality of data elements of the second clock domain.

19. The system of claim 17, wherein the clock gating the plurality of data elements of the second clock domain occurs concurrently with the outputting data from the plurality of data elements of the first clock domain.

20. The system of claim 17, wherein the data elements of the first clock domain and the data elements of the second clock domain are configured to store data for processing by a digital circuit.

* * * * *